US008202768B2

(12) United States Patent
Lander

(10) Patent No.: US 8,202,768 B2
(45) Date of Patent: Jun. 19, 2012

(54) METHOD OF FABRICATING A SEMICONDUCTOR DEVICE

(75) Inventor: Robert James Pascoe Lander, Leuven (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 12/575,082

(22) Filed: Oct. 7, 2009

(65) Prior Publication Data

US 2011/0079852 A1 Apr. 7, 2011

(51) Int. Cl.
*H01L 21/00* (2006.01)
*H01L 21/84* (2006.01)

(52) U.S. Cl. .............. 438/149; 438/151; 257/E21.32; 257/E21.561

(58) Field of Classification Search .......... 438/149, 438/151, 157, 199, 283, 479; 257/E21.32, 257/E21.561, E21.7
See application file for complete search history.

(56) References Cited

U.S. PATENT DOCUMENTS

| | | | |
|---|---|---|---|
| 6,617,210 B1 | 9/2003 | Chau et al. | |
| 6,770,516 B2 | 8/2004 | Wu et al. | |
| 6,924,560 B2 | 8/2005 | Wang et al. | |
| 7,122,412 B2 | 10/2006 | Chen et al. | |
| 7,187,046 B2 | 3/2007 | Wu et al. | |
| 7,205,601 B2 | 4/2007 | Lee et al. | |
| 7,244,640 B2 | 7/2007 | Yang et al. | |
| 7,300,837 B2 | 11/2007 | Chen et al. | |
| 2006/0138553 A1* | 6/2006 | Brask et al. | 257/369 |
| 2010/0148217 A1* | 6/2010 | Simonelli et al. | 257/192 |

OTHER PUBLICATIONS

Junji Koga, Shin-Ichi Takagi and Akira Toriumi; A Comprehensive Study of MOSFET Electron Mobility in Both Weak and Strong Inversion Regimes; 1994; p. IEDM 94-475-p. IEDM 94-478; 18.6.1-18.6.4; ULSI Research Laboratories, Toshiba Corporation; IEEE; Kawasaki, Japan.
S.E. Thompson, G. Sun, K. Wu, J. Lim and T. Nishida; Key Differences for Process-Induced Uniaxial vs. Substrate-Induced Biaxial Stressed Si and Ge Channel MOSFETS; 2004; pp. 1-4; 0-7803-8684-1/04; University of Florida, IEEE; Gainesville, Florida.
Ali Khakifirooz and Dimitri A. Antoniadis; Scalability of Hole Mobility Enhancement in Biaxially Strained Ultrathin Body SOI; May 5, 2006; p. 402-p. 404; vol. 27; IEEE Electron Device Letters; IEEE.

* cited by examiner

*Primary Examiner* — Hoai V Pham
(74) *Attorney, Agent, or Firm* — Haynes and Boone, LLP

(57) ABSTRACT

The present disclosure provides a semiconductor device and method of fabricating a semiconductor device. In an embodiment, the semiconductor device is a finFET device. In an embodiment, the semiconductor device is a silicon on insulator (SOI) device. A method of fabricating the semiconductor device includes providing a substrate, forming an oxide layer on the substrate, forming a fin on a portion of the oxide layer, forming a high k dielectric layer on a portion of the oxide layer and on a portion of the fin, forming a tuned, stressed metal gate on the dielectric layer, and forming a poly-cap on the metal gate. The method of fabrication provided may allow use of SOI substrate or bulk silicon substrates.

16 Claims, 8 Drawing Sheets

METHOD OF FABRICATING A SEMICONDUCTOR DEVICE

BACKGROUND

The present disclosure relates generally to the field of fabrication of semiconductor devices, and more specifically to a method of fabricating a fin-type field effect transistor (finFET) or a fully depleted silicon on insulator (FDSOI) device, or a portion thereof.

Double-gate metal-oxide semiconductor field-effect transistors (MOSFETs) are MOSFETs that incorporate two gates into a single device. Some of these devices may be known as finFETs when their structure includes a thin "fin" extending from a substrate. Planar versions of the double-gate MOSFETs also exist without the fin. Silicon based finFETs have been successfully fabricated using conventional MOSFET technology. A typical finFET is fabricated on a substrate with an overlying insulating layer with a thin 'fin' extending from the substrate, for example, etched into a silicon layer of the substrate. The channel of the FET is formed in this vertical fin. A gate is provided over (e.g., wrapping) the fin. The double gate is beneficial in that there is a gate on both sides of the channel allowing gate control of the channel from both sides. Further advantages of finFETs include reducing the short channel effect and higher current flow. Other finFET architectures may include three or more effective gates.

FinFET and fully depleted planar SOI devices are particularly attractive as an alternative to conventional planar bulk CMOS devices because improved gate control with thin Si films and two gates enables aggressive scaling of the device dimensions without significant penalties in terms of static leakage, short-channel effects or performance degradation. FinFETs can be made using bulk technology. However, further scaling of conventional planar bulk CMOS devices is difficult below about 45 nm technology.

However, a significant obstacle to manufacturing finFETs and FDSOI MOSFETs is the very small dimensions required for the fin or Si film in order to benefit from the thin film architecture. For example, this may be a gate-length ~⅓ for finFETs and a gate-length ~¼ for single-gate FDSOI. Thus, for a device with a 30 nm width, a 10 nm fin or 7 nm Si film is needed. This target can be achieved but the variations in device performance, due to variations around the nominal value, would be so large that circuit designs would not benefit from the nominal performance because the designers would need to fix the clock frequency according to the delay of the worst-case device. Furthermore, device performance is limited by carrier scattering due to the roughness of the conducting interfaces. This is a well-understood and unavoidable effect in planar bulk devices and is also present in thin-film devices.

As such, an improved semiconductor device and fabrication method of the same is desired.

SUMMARY

In an embodiment, the present disclosure provides a semiconductor device and method of fabricating a semiconductor device. In an embodiment, the semiconductor device is a finFET device. In an embodiment, the semiconductor device is a silicon on insulator (SOI) device. A method of fabricating the semiconductor device includes providing a substrate, forming an oxide layer on the substrate, forming a fin on a portion of the oxide layer, forming a high k dielectric layer on a portion of the oxide layer and on a portion of the fin, forming a tuned, stressed metal gate on the dielectric layer, and forming a poly-cap on the metal gate. A method of fabrication provided may allow use of SOI substrate or bulk silicon substrates.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and in an embodiment, to a finFET and/or a FDSOI device and method of fabricating a finFET and/or FDSOI device (e.g., device or portion of a device).

A method is disclosed to correct threshold voltage (Vt) fluctuations and suppress roughness scattering where these are caused by film thickness variations in a finFET. These systems also contemplated for silicon on insulator (SOI), such as fully depleted SOI (FDSOI), devices as should be readily understood by those having ordinary skill in the art. In an embodiment, a stressed layer in the gate electrode (for example a metal gate) is applied such that a variation in film thickness leads to a variation in the strain transferred to the Si film. This strain distorts the band structure of the Si film opposing local or gross variations in carrier energy due to quantum confinement effects—the origin of parametric variations and roughness scattering.

It is understood, however, that specific embodiments are provided as examples to teach the broader concept, and one of ordinary skill in the art can easily apply the teaching of the present disclosure to other methods or apparatus. In addition, it is understood that the methods and apparatus discussed in the present disclosure include some conventional structures and/or processes. Because these structures and processes are well known in the art, they will only be discussed in a general level of detail. Furthermore, reference numbers may be repeated throughout the drawings for sake of convenience and example, and such repetition does not indicate any required combination of features or steps throughout the drawings.

Moreover, the formation of a first feature over and on a second feature in the description that follows may include embodiments in which the first and second features are formed in direct contact, and may also include embodiments in which additional features may be formed interposing the first and second features, such that the first and second features may not be in direct contact. FinFET device as the term is employed in the current disclosure provides any fin-based transistor. A finFET element may include a finFET device (e.g., transistor) or any portion thereof (e.g., a fin). In addition, though described herein comprising certain elements, one skilled in the art would recognize the applicability of the present disclosure to other chemical composition finFETs.

Figure 1:
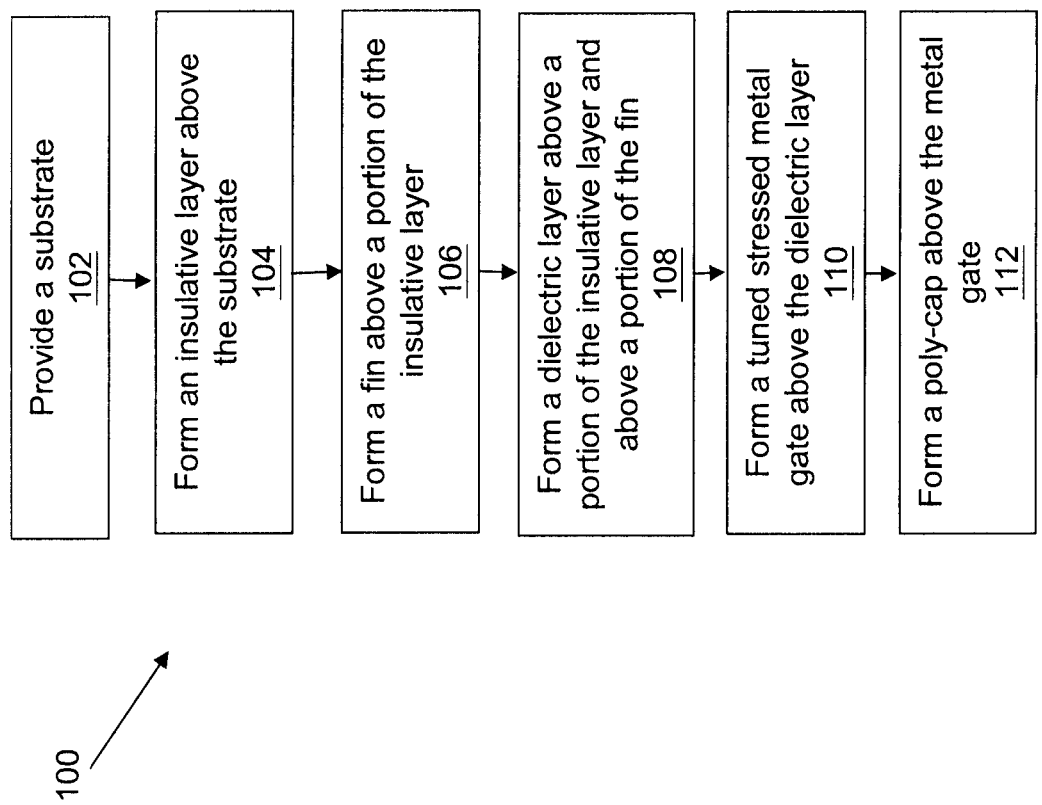
FIG. 1 illustrates a flow chart of an embodiment of a method to fabricate a finFET semiconductor device in accordance with the present disclosure.
Figure 2:
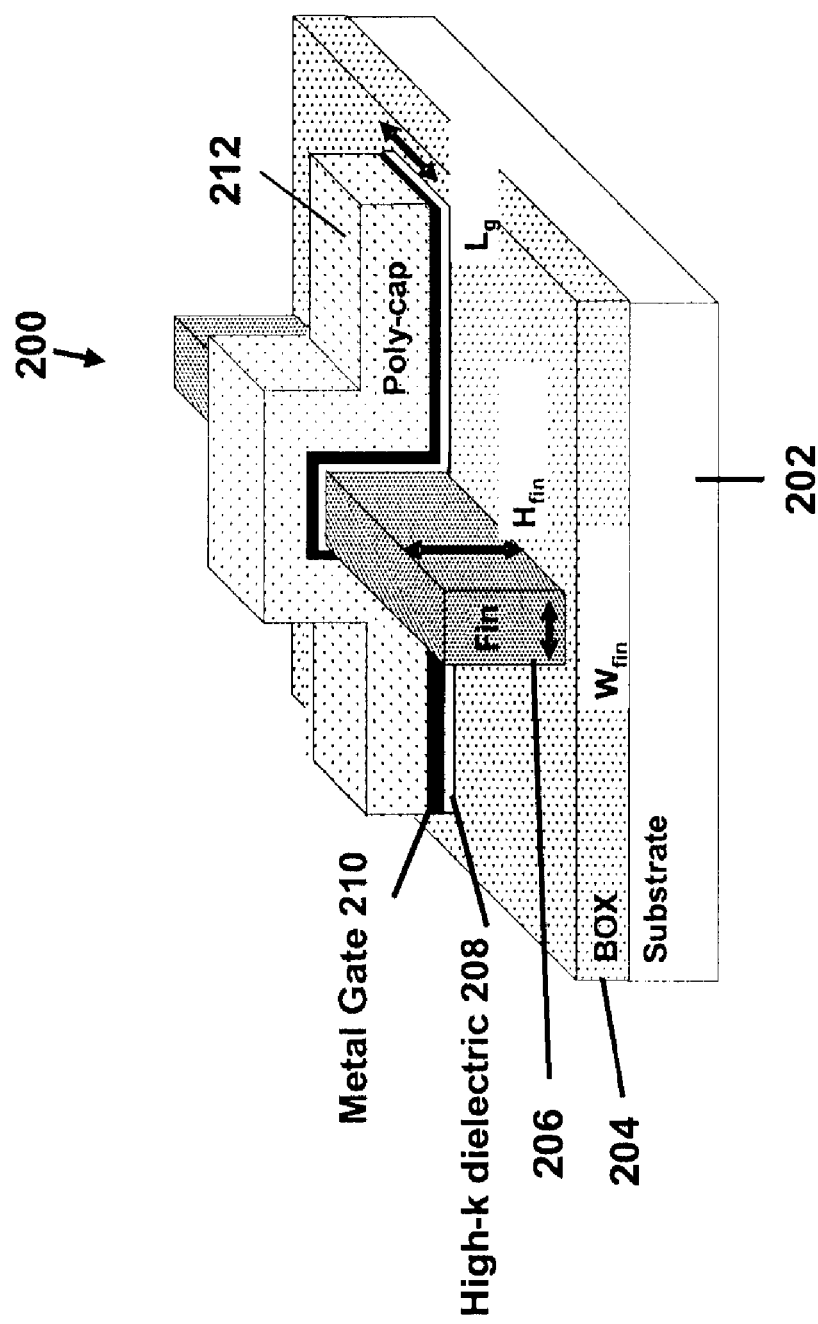
FIG. 2 illustrates an embodiment of a finFET device constructed with the method of FIG. 1.

FIG. 1 illustrates a flow chart of an embodiment of a method 100 to fabricate a finFET semiconductor device 200, as shown in FIG. 2, in accordance with the present disclosure. The method 100 begins at block 102 where a substrate 202 is provided. In an embodiment, the substrate 202 includes a silicon substrate (e.g., a wafer). The substrate 202 may be silicon in a crystalline structure. In other embodiments, the substrate 202 may include other elementary semiconductors such as germanium, or include a compound semiconductor such as, silicon carbide, gallium arsenide, indium arsenide, and indium phosphide. In an embodiment, the substrate 202 includes a silicon-on-insulator (SOI) substrate. The SOI substrate may be fabricated using separation by implantation of oxygen (SIMOX), wafer bonding, and/or other suitable methods. The substrate 202 may include isolation regions, doped regions, and/or other features. The method 100 then proceeds to block 104 where an insulative oxide layer 204 is formed on the substrate 202. The insulator layer 204 may include silicon. In an embodiment, the insulator layer 204 is silicon oxide. The substrate 202 and the insulator layer 204 may be components of an SOI substrate (e.g., including an overlying silicon layer patterned to form fins 206). The insulator layer 204 may include silicon oxide, sapphire, and/or other suitable insulating materials. The insulator layer 204 may be a buried oxide layer (BOX). The insulator layer 204 may be formed using processes such as, implantation (e.g., SIMOX), oxidation, deposition, and/or suitable processes. In an embodiment, the insulator layer 204 may include a raised portion (e.g., a fin).

Next, the method 100 proceeds to block 106 where one or more fins 206 are formed on a portion of the insulative layer 204. The fin 206 may be fabricated using suitable processes including photolithography and etch processes. The photolithography process may include forming a photoresist layer (resist) overlying the substrate 202 (e.g., on a silicon layer), exposing the resist to a pattern, performing post-exposure bake processes, and developing the resist to form a masking element including the resist. The masking element may then be used to etch the fin 206 into the silicon layer. The fin 206 may be etched using reactive ion etch (RIE) and/or other suitable processes.

In an embodiment, the fin 206 is formed by double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

In an embodiment, the fin 206 is approximately 10 nm ($W_{fin}$) wide and approximately 60 nm ($H_{fin}$) high. However, it should be understood that other dimensions may be used for the fin 206. In an embodiment one or more fins 206 may be disposed on the insulator layer 204. In an embodiment, the fin 206 comprises silicon. The fin 206 may be fabricated by patterning a silicon layer overlying the insulator layer 204 (e.g., an upper silicon layer of a silicon-insulator-silicon stack of an SOI substrate). In an embodiment, the fin 206 is a silicon fin (Si-fin). The fin 206 may be formed, for example, by etching a layer of silicon on the substrate 202. The layer of silicon may be a silicon layer of an SOI substrate (e.g., overlying an insulator layer).

The method 100 then proceeds to block 108 where a dielectric layer 208 is formed above a portion of the insulative layer 204 and above a portion of the fin 206. The dielectric layer 208 may be a high-k dielectric. As should be understood by those having ordinary skill in the art, a high-k dielectric is a material that has a dielectric constant that is greater than that of silicon dioxide. The gate dielectric layer 208 may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer 208 may be formed using processes such as, photolithography patterning, oxidation, deposition, etching, and/or other suitable processes. In an embodiment, the dielectric layer 208 comprises SiO2+HfSiO. However, it should be understood that other elements may be used for the dielectric layer 208.

The method 100 proceeds next to block 110 where a tuned, stressed metal gate 210 is formed above the dielectric layer 208 above a portion of the fin 206. In an embodiment, the metal gate 210 and the dielectric layer 208 form a high-k metal gate and may include a gate electrode. Numerous other layers may also be present, for example, capping layers, interface layers, spacer elements, and/or other suitable features. The gate electrode 210 may include polysilicon, silicon-germanium, a metal including metal compounds such as, Mo, Cu, W, Ti, Ta, TiN, TaN, NiSi, CoSi, and/or other suitable conductive materials known in the art. The gate electrode 210 may be formed using processes such as, physical vapor deposition (PVD), chemical vapor deposition (CVD), plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes. Stressing and tuning of the metal gate 210 is provided in more detail below. The method 100 proceeds then to block 112 where a poly silicon cap 212 is formed on the metal gate 210. In an embodiment, the dielectric layer 208, the metal gate 210 and the poly silicon cap 210 are approximately 30 nm.

The method 100 may continue to provide steps fabricating other features of finFET elements, including, for example, doping the fin structure, forming a gate structure including a gate dielectric and gate electrode on the fins, forming of source/drain regions, forming contact, interconnect structures, and/or other suitable processes and features.

It should be understood by those having ordinary skill in the art that the fabrication steps provided above an others steps for fabricating these and other features of the finFET device 200 may include an epitaxial or other layer grown on the fin 206 and/or other portions of the finFET device 200. In an embodiment, an epitaxial layer may be grown by a CMOS compatible epitaxial process. The epitaxial process may include chemical vapor deposition (CVD) technique such as vapor-phase epitaxy (VPE), and/or other suitable processes known in the art. The epitaxial process may use gaseous (or liquid) precursors, which interact with composition of the fins (e.g., silicon). In an embodiment, layers may be removed by suitable etching processes including wet etch, dry etch, plasma etch, and/or other suitable processes. In an embodiment, a wet etch including a diluted hydrofluoric acid (dHF) solution is used to remove one or more layers. The etching process may also remove a portion of the underlying insulator layer. Thus, a recess in the underlying insulator layer may be formed. In an embodiment, a channel of a finFET device may be formed in the upper portion of the fin structure.

Therefore, provided is a method 100 for forming a finFET device having one or more fins with a tuned, stressed metal gate above the fin on a substrate. The method 100 may use CMOS compatible processes. The method 100 also allows for use of an SOI substrate.

The finFET device 200 may include a channel of the finFET device 200. The fin structure 206 may be doped to provide a suitable channel for an N-finFET (NMOS device) or P-finFET (PMOS device). The fin structure 206 may include suitable dopants such as, p-type dopants (e.g., boron) and/or n-type dopants (e.g., phosphorous). The fin structure 206 may be doped using processes such as, ion implantation, diffusion, annealing, and/or other suitable processes.

The finFET structure 200 may include and/or be coupled to source and drain regions associated with other finFET devices. The finFET device including the finFET device 200 may be a device included in a microprocessor, memory cell, and/or other semiconductor devices.

Device performance is generally limited by carrier scattering due to the roughness of the conducting interfaces. This is a well-understood and unavoidable effect in planar bulk devices and is also present in thin-film devices. The effects of carrier mobility vs "effective" vertical electric field for electron inversion layers at room temperature is well known. This may be an effect due to devices having different pre-gate cleaning methods, which, in turn, provides different roughness on device surfaces. Surface roughness scattering together with phonon scattering is known to determine the mobility at high vertical fields (e.g., strong inversion).

As such, a method is disclosed to correct threshold voltage (Vt) fluctuations and suppress roughness scattering where these are caused by film thickness variations. A stressed layer in the gate electrode (e.g., a metal gate as shown in FIG. 2) is applied such that any variation in film thickness leads to a variation in the strain transferred to the Si film. This strain distorts the band structure of the Si film opposing any local or gross variations in carrier energy due to quantum confinement effects where these are the origin of parametric variations and roughness scattering.

Figure 3:
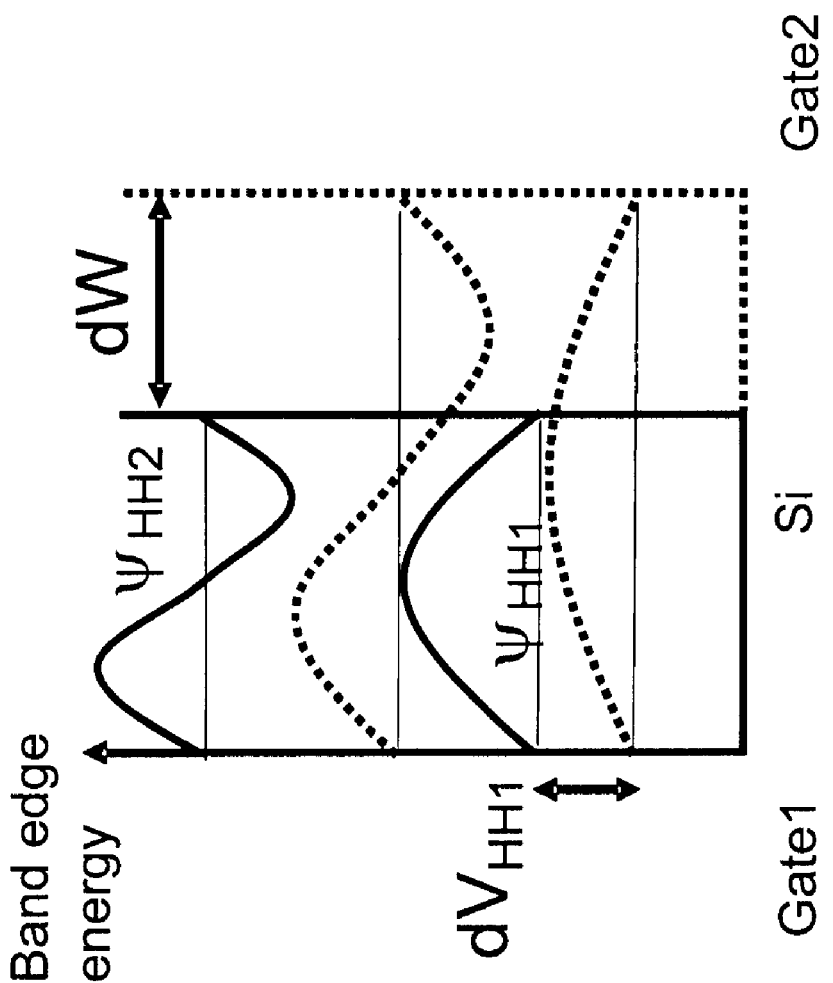
FIGS. 3 and 4 are graphs illustrating the impact of Si film thickness variations (dW) on the energy of the lowest heavy hole energy level ($dV_{HH1}$) for thin and thick films.
Figure 4:
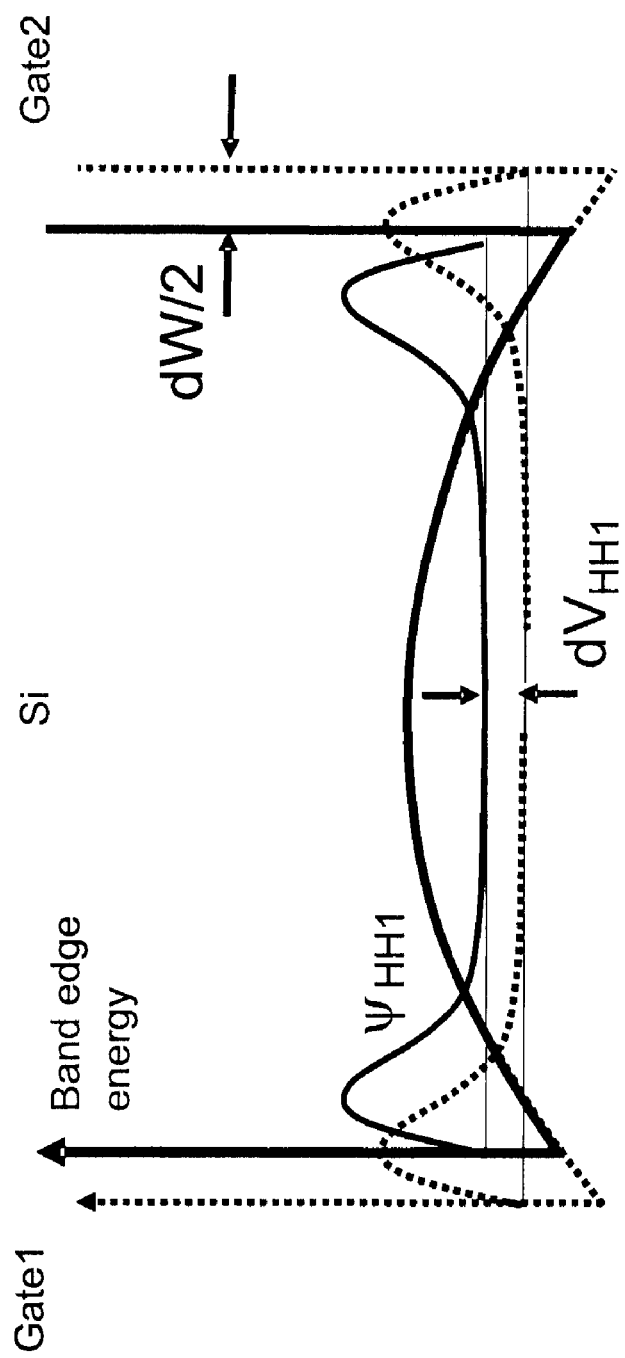

FIGS. 3 and 4 are graphs illustrating the impact of Si film thickness variations (dW) on the energy of the lowest heavy hole energy level ($dV_{HH1}$) for thin and thick films. FIG. 3 illustrates an influence of fin width variations on carrier energy/Vt for a square well where short range roughness is not assumed and the shift is substantially independent of roughness-length scale. It should be understood that δW results in shift δV in energy level where V~n2h2/(8 m*Wfin2)→δV~-n2δWfinh2/(4 m*Wfin3)→~-4 meV variation for 10 nm Wfin with 2 nm roughness amplitude. FIG. 4 illustrates an influence of fin width variations on carrier energy/Vt for wide well or strong inversion. In FIG. 4, very short range roughness is assumed. It should be understood that δW results in shift δV in energy level ~>δV~-δWfin*Efield for short range roughness→δV~0 for long range roughness 0→70 meV for 2 nm Wfin variation @inversion layer density 1e13 cm2. As such, FIGS. 3 and 4 illustrate the impact of film thickness variations on the energy of the lowest heavy hole energy level. For short range roughness this disturbs the motion of the carrier and leads to scattering events which degrade the carrier mobility, and thus the drive current. For long range roughness with respect to device dimensions, this shifts the Vt of the device for narrow fin case, as is shown in FIG. 3.

Figure 5:
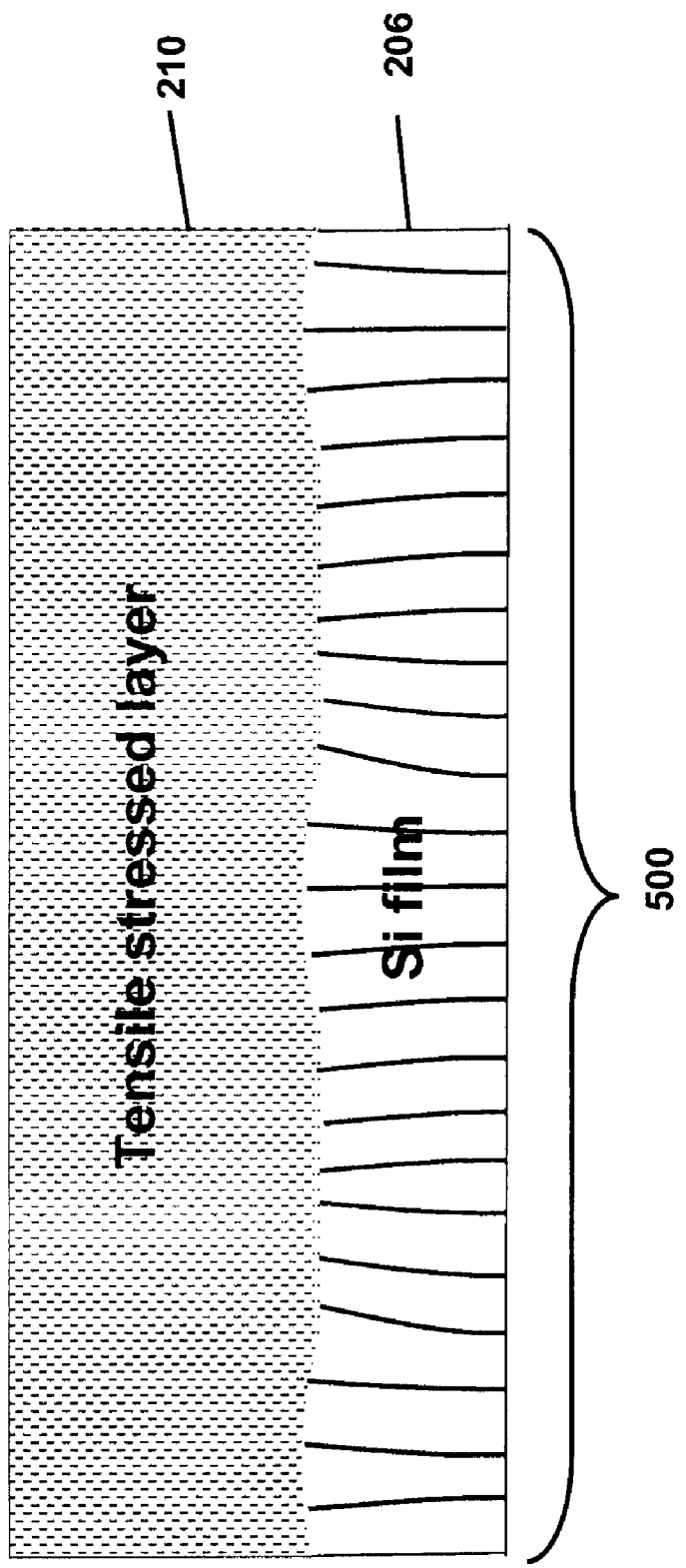
FIGS. 5 and 6 illustrate the impact of tensile stressed film upon the Si under layer for thick and thin Si film.
Figure 6:
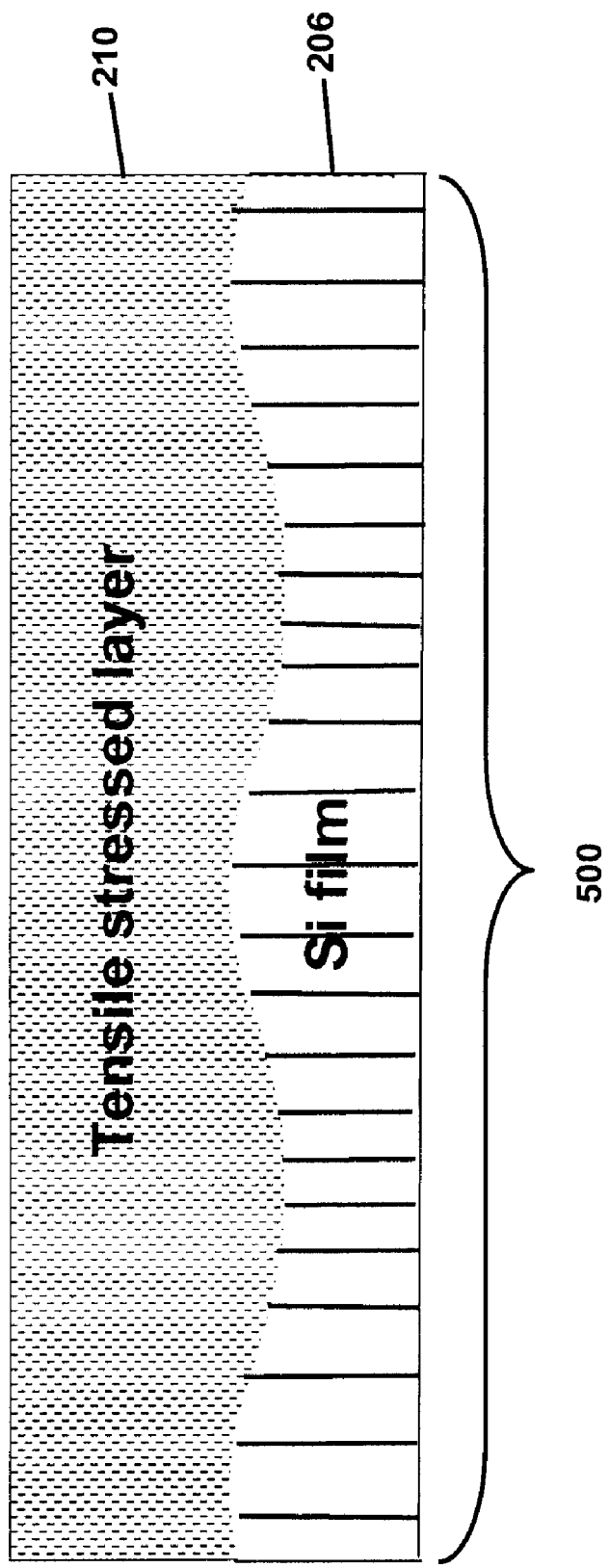

FIGS. 5 and 6 illustrate the impact of tensile stressed film upon the Si layer for thick and thin Si film. Specifically, FIGS. 5 and 6 illustrate the effect of a tensile stressed layer, such as the high-K/metal gate layers of 208 and 210 shown in FIG. 2, on one side of the Si film, such as the fin 208 shown in FIG. 2, upon the Si lattice structure (shown as lattice lines 500 in the presence of thickness variations of the Si film (e.g., 206). Where the Si (e.g., 206) is locally thinner, more of the stress of the high-K/metal gate layers of 208 and 210 is transferred to the Si (e.g., 206) and, if the average Si thickness is reduced, then more stress from the high-K/metal gate layers of 208 and 210 is transferred more uniformly though the Si layer (e.g., 206). This is shown as strain where the lattice lines 500 are shown closer together in the thinner portions of the Si film (e.g., 206). In other words, the stressed gate stack (e.g., the high-K/metal gate layers of 208 and 210) will redistribute stress to the Si layer (e.g., 206). As should be understood, the thinner Si layer (e.g., 206) will accommodate higher strain, more uniformly. As such, a planarizing effect will increase local stress for thinner regions of the Si layer (e.g., the fin 206).

Theoretical calculations of impact of compressive strain upon Si band edges is well known in the art. These calculations generally show a reduction in the band gap from both conduction and valence band edges with biaxial and uniaxial compressive strain. As such, this would result in a decrease in Vt for both NMOS and PMOS. In an embodiment, using the values for the strain dependence of the band edges and combining with a rough calculation of the strain in a Si film due to a 5 nm 1 GPa overlayer, one can estimate the band shift vs Si thickness and vs Si roughness. Variations in the film thickness will lead to variations in uniaxial and/or biaxial strain in the film.

The impact of uniaxial and biaxial compressive strain upon Si conduction and valence band edges for surface oriented Si with uniaxial stress is also known in the art. Generally, a conduction band determines Vt for electron conduction of NMOS devices. Also, dominate hole band generally determines energy for hole conduction of PMOS devices. With respect to biaxial strain on the valence band energies in bulk silicon and ultra-thin band (UTB) SOI, it is also known that in UTB SOI, the degeneracy of the valence band is already removed due to a strong confinement. In bulk silicon, the band splitting between the light and heavy holes increases monotonically. On the other hand, in UTB SOI, and for tensile strains less than about 1%, the bands merge and then start to diverge for higher values of strain. Band shifts due to strain fluctuations can compensate band shifts due to quantum confinement. For example, if applied to an embodiment of a device shown in FIG. 2, band shifts due to strain may be shown assuming 5 nm TiN stressor layer on Si (baseline), a 1 GPa tensile stress in TiN (0.6 GPa measured for ALD TiN), and a 2 nm Wfin roughness variation (σWaverage~1 nm measured) (σLWR~2 nm measured). This example assumes uniform strain distribution through the fin 206. The Si thickness variation determines valence band fluctuation for narrow fins and metal gate thickness variation determines valence band fluctuation for wide fins (narrow fin approximation breaks down here).

Figure 7:
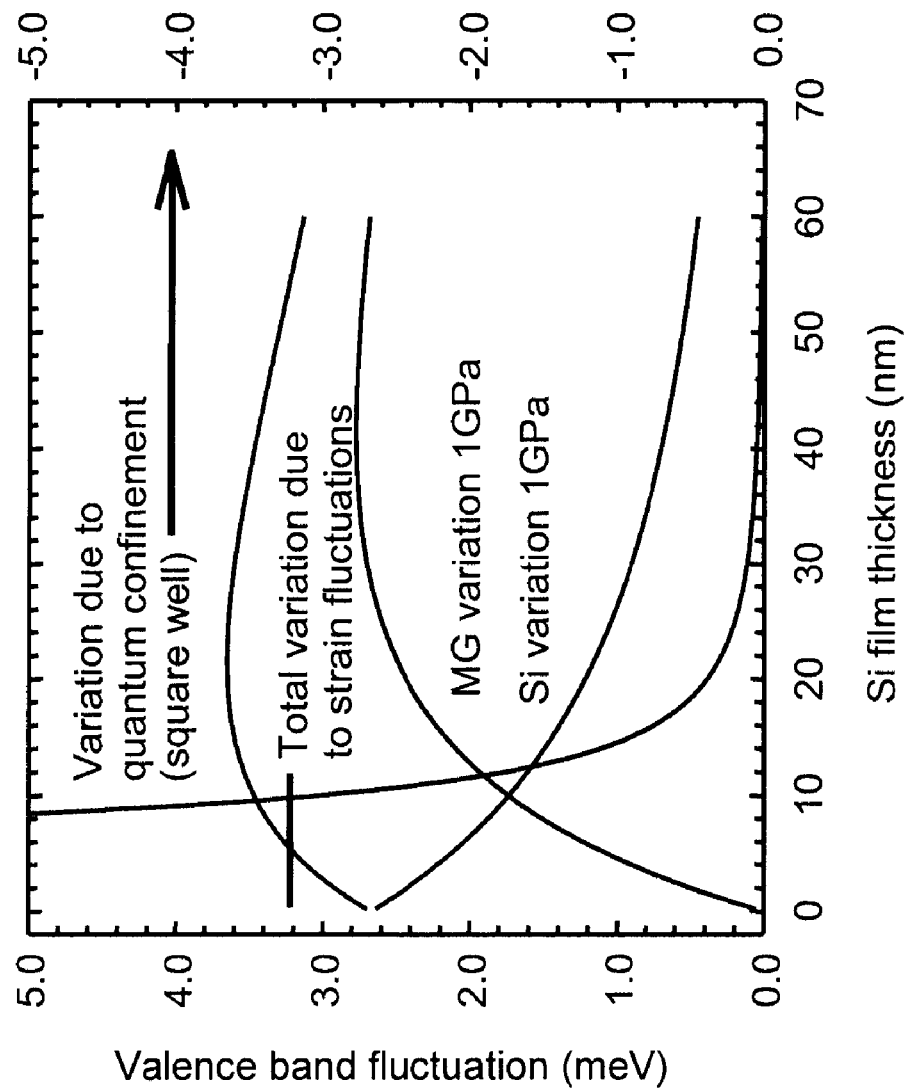
FIG. 7 illustrates an embodiment of a shift of the valence band edge due to strain fluctuations calculated in the thin film limit taking a 5 nm TiN stress layer with 1 GPa tensile stress on both sides of a Si film for range of nominal thickness for 2 nm Wfin variations, where strain fluctuations in the Si layer cancel energy due to roughness for the Si thickness ~10 nm.
Figure 8:
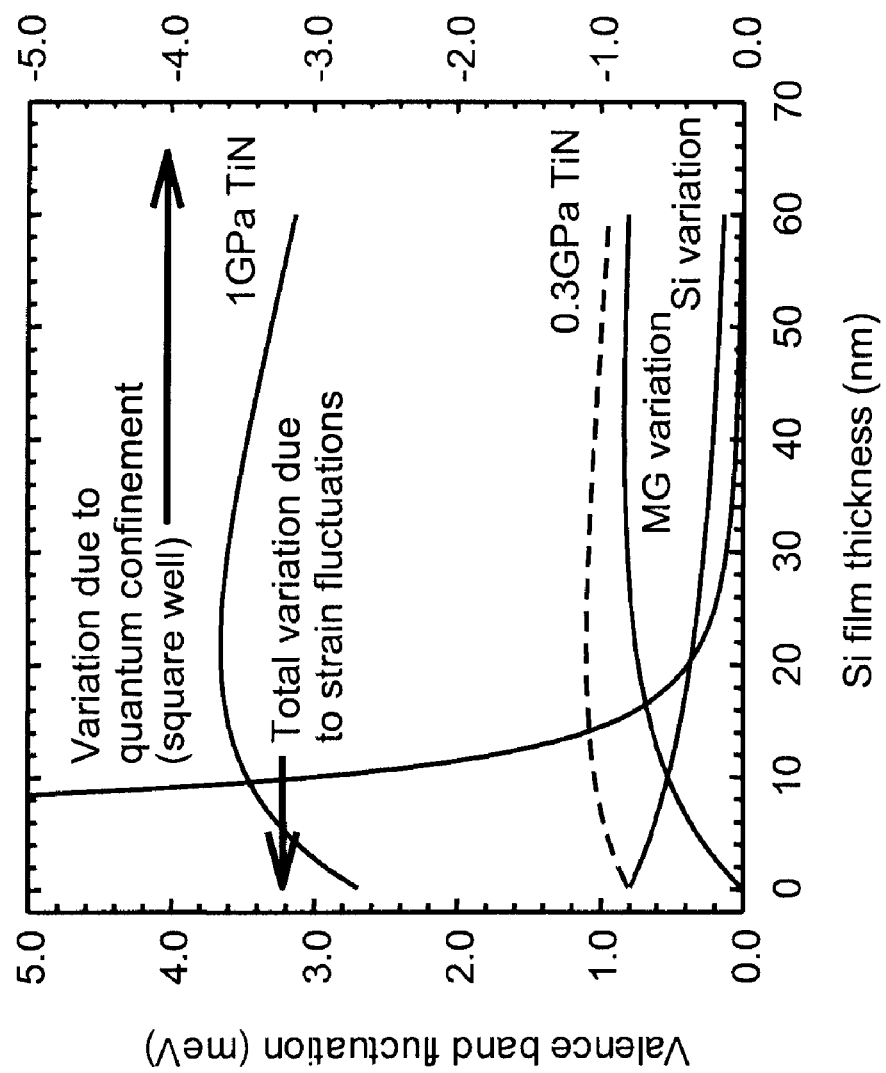
FIG. 8 illustrates an embodiment of a shift of the valence band edge due to strain fluctuations calculated in the thin film limit taking a 5 nm TiN stress layer with 1 GPa and 1.3 GPa tensile stress for 2 nm Wfin variations, where for 0.3 GPa strain fluctuations in Si layer cancel energy shift due to roughness for Si thickness ~14 nm.

FIG. 7 illustrates an embodiment of a shift of the valence band edge due to strain fluctuations calculated in the thin film limit taking a 5 nm TiN stress layer with 1 GPa tensile stress on both sides of a Si film for range of nominal thickness, where strain fluctuations in the Si layer cancel energy due to roughness for the Si thickness ~10 nm. FIG. 8 illustrates an embodiment of a shift of the valence band edge due to strain fluctuations calculated in the thin film limit taking a 5 nm TiN stress layer with 1 GPa and 1.3 GPa tensile stress, where for 0.3 GPa strain fluctuations in Si layer cancel energy shift due to roughness for Si thickness ~14 nm.

In FIG. 7, the shift of the valence band edge due to strain fluctuations is calculated in the thin film limit (uniform vertical strain profile in film as in FIG. 6) taking a 5 nm TiN stress layer with 1 GPa tensile stress on both sides of a Si film (analogous to a FinFET). As shown, band shifts due to strain cancel band shifts due to quantum confinement for ~13 nm wide fin (no planarization) and ~10 nm wide fin (with planarization). Short range roughness can influence Vt. Vt is a measure of the energy barrier to carrier transit through the channel so Vt shifts are less for "short range" roughness but need not be zero. Mobility is degraded if the length scale of the energy level fluctuations is comparable to the quantum mechanical "wavelength" of the carriers. In an embodiment, the wavelength is ~<7 nm (e.g., "short range"). Because the strain fluctuations compensate for both long and short-range roughness, they can be used to reduce Vt fluctuations and reduce carrier scattering (increasing mobility).

FIGS. 7 & 8 show the shift due to quantum confinement effects for a narrow fin (e.g., the case shown in FIG. 3). This shift will apply for long and short range roughness. There are two contributions to the strain-induced shift: one from thickness variations in Si thickness (dominant for thin Si films) and one due to correlated variations in metal gate thickness (dominant for thick films). The combination cancels the fluctuations due to quantum confinement at Si film thickness ~10 nm. If, as shown in FIG. 8, a different film thickness is required then the stress & thickness in the TiN layer can be re-optimized to eliminate variations at that thickness. In this embodiment, a lower TiN stress (e.g., ~0.3 GPa) is provided and band shifts due to strain cancel band shifts due to quantum confinement for ~20 nm wide fin (no planarization) and ~14 nm wide fin (with planarization).

The conduction band edge exhibits a similar dependence upon strain and so the same technique is applied to enhance mobility and reduce Vt fluctuations in NMOS devices. The dependence upon strain is larger for PMOS and so separate optimization of the NMOS stressor layer may be required.

This effect would also reduce or eliminate Vt fluctuations due to fin CD variations. The fact that uniaxial stress may be more dominant for the large scale fluctuations that cause Vt fluctuations may require larger stresses or thicker stressor layers, but the dependence of the band edge upon strain is similar in nature and so the same technique can be applied using thicker stressor layers or higher stress.

As should be readily understood by those having ordinary skill in the art, embodiments of the present disclosure, such as the device 200 shown in FIG. 2, may be fabricated using the method 100 shown in FIG. 1. In an embodiment, a FinFET and FDSOI devices includes metallic gate electrodes in order to achieve the desired threshold voltage Vt. The stress in these metal layers (e.g., the metal gate 210) can be tuned by changing deposition conditions and/or by annealing. Annealing should be understood to relate to heat treatment to which a device is subjected in order to modify properties (e.g., stress/strain) of materials/structures processed on its surface or in the bulk. In an embodiment, the device can be tuned by annealing at approximately 900 C. However, it should be understood than other temperatures may be used to stress the layers. In an embodiment, metal layer stresses ~1 GPa is achievable without detrimental effects for such thin layers. In an embodiment, the FinFET device of FIG. 2 is a ~32 nm technology device. In an embodiment, a FinFET device may be fabricated with ~2 nm HfSiO gate dielectric (e.g., 208) and a ~5 nm TiN gate electrode (e.g., 210). For this embodiment, a target Si fin width (e.g., Wfin) for a 32 nm CMOS technology node is ~10 nm. Thus the parameters used in generating FIG. 7 are compatible with a manufacturable 32 nm FinFET technology. The presence of the gate dielectric has not been included in the calculation and this would suppress the strain transfer to the Si fin. However, the dielectric may itself be stressed and may thus, enhance the effect. Inclusion of a dielectric of finite thickness would require larger stresses or thicker metal layers to entirely cancel the band edge fluctuations due to quantum confinement effects but any effect would be beneficial in terms of Vt fluctuations or carrier mobility. It should be understood that other materials and dimensions may be used with the present disclosure.

The calculations of the strain transfer and impact upon band edges, shown in FIG. 7 are also valid for planar FDSOI devices if the Si thickness in FIG. 7 is divided by 2. Thus, more stress is required to achieve the same magnitude of shift. The dependence of the band edge upon quantum confinement is less clear but similar in nature and magnitude so the same approach can be applied although determining the optimum metal stress/thickness in that case requires more extensive calculations as should be understood by those having ordinary skill in the art.

It should be readily understood that if finFETs, planar double gate devices or single-gate planar FDSOIs are used as the basic elements in CMOS processes (e.g., replacing planar bulk CMOS devices), then embodiments of the present disclosure could be applied wherever those CMOS transistors are needed.

Although only a few exemplary embodiments of this invention have been described in detail above, those skilled in the art will readily appreciate that many modifications are possible in the exemplary embodiments without material departing from the novel teachings and advantages of this disclosure.

What is claimed is:

1. A method of fabricating a semiconductor device comprising:
    providing a substrate;
    forming an oxide layer on the substrate;
    forming a fin on a portion of the oxide layer;
    forming a high k dielectric layer on a portion of the oxide layer and on a portion of the fin;
    forming a tuned, stressed metal gate on the dielectric layer; and
    forming a poly-cap on the metal gate.

2. The method of claim 1, wherein the substrate is a silicon substrate.

3. The method of claim 1, wherein the tuned, stressed metal gate is tuned by deposition conditions and/or by annealing after deposition.

4. The method of claim 3, wherein annealing is performed at approximately 900° C.

5. The method of claim 1, wherein the fin comprises poly silicon.

6. The method of claim 5, wherein the metal gate comprises titanium nitride.

7. The method of claim 6, wherein the fin has a width that is in a range of approximately ½-⅓ a length of the gate.

8. A method of fabricating a finFET device comprising:
    providing a substrate;

forming an oxide layer on the substrate;
forming a fin on a portion of the oxide layer;
forming a dielectric layer on a portion of the oxide layer and on a portion of the fin; and
forming a tuned, stressed metal gate on the dielectric layer, wherein the metal gate is formed and tuned such that variation in fin thickness leads to variation in strain transferred to the fin, thereby distorting a band structure of the fin opposing local or gross variations in carrier energy due to quantum confinement effects.

9. The method of claim 8, wherein the tuned, stressed metal gate is tuned by deposition conditions and/or by annealing after deposition.

10. The method of claim 9, wherein annealing is performed at approximately 900° C.

11. The method of claim 8, wherein the substrate is a silicon-on-insulator (SOI) substrate.

12. The method of claim 8, further comprising:
   forming a source and a drain in the substrate.

13. The method of claim 8, wherein stress on the metal gate is approximately 0.3 GPa to about approximately 1.0 GPa tensile stress.

14. The method of claim 8, wherein the metal gate is formed to be approximately 5 nm in width.

15. The method of claim 8, wherein the dielectric layer is a high k dielectric layer.

16. The method of claim 15, wherein the dielectric layer is formed comprising HfSiO.

\* \* \* \* \*